United States Patent
Kimura

(10) Patent No.: US 7,575,692 B2
(45) Date of Patent: Aug. 18, 2009

(54) METHOD FOR ETCHING CHROMIUM THIN FILM AND METHOD FOR PRODUCING PHOTOMASK

(75) Inventor: Yasuki Kimura, Tokyo (JP)

(73) Assignee: Hoya Corporation, Tokyo (JP)

( * ) Notice: Subject to any disclaimer, the term of this patent is extended or adjusted under 35 U.S.C. 154(b) by 107 days.

(21) Appl. No.: 10/529,152

(22) PCT Filed: Apr. 6, 2004

(86) PCT No.: PCT/JP2004/004938

§ 371 (c)(1), (2), (4) Date: Mar. 24, 2005

(87) PCT Pub. No.: WO2004/093178

PCT Pub. Date: Oct. 28, 2004

(65) Prior Publication Data

US 2006/0102587 A1 May 18, 2006

(30) Foreign Application Priority Data

Apr. 11, 2003 (JP) .............................. 2003-108208

(51) Int. Cl.
*C23F 1/00* (2006.01)
(52) U.S. Cl. .............................. 216/12; 216/41; 216/46; 216/67; 216/75
(58) Field of Classification Search .................... 216/12
See application file for complete search history.

(56) References Cited

U.S. PATENT DOCUMENTS

| | | | | |
|---|---|---|---|---|
| 4,213,818 A | * | 7/1980 | Lemons et al. .............. | 438/719 |
| 4,613,401 A | * | 9/1986 | Hoshino ...................... | 216/67 |
| 4,723,903 A | * | 2/1988 | Okazaki et al. ............. | 425/385 |
| 4,985,319 A | * | 1/1991 | Watakabe et al. .............. | 430/5 |
| 5,948,570 A | * | 9/1999 | Kornblit et al. ................ | 430/5 |
| 5,976,986 A | | 11/1999 | Naeem et al. | |
| 6,383,403 B1 | * | 5/2002 | Sekiya et al. ................. | 216/70 |
| 6,531,403 B2 | * | 3/2003 | Ezaki .......................... | 438/710 |
| 6,544,894 B1 | | 4/2003 | Kobayashi | |

(Continued)

FOREIGN PATENT DOCUMENTS

JP 01-149425 A 6/1989

(Continued)

OTHER PUBLICATIONS

Hyuk-Joo Kwon et al., Loading Effect Parameters at Dry Etcher System and Their Analysis at Mask-to-mask Loading and Within-Mask Loading, 2002, SPIE vol. 4562, pp. 79-87.*

(Continued)

*Primary Examiner*—Allan Olsen
(74) *Attorney, Agent, or Firm*—Sughrue Mion, PLLC

(57) ABSTRACT

An object to be processed has a chromium-based thin film made of a material containing chromium. The thin film is etched using a resist pattern as a mask. The thin film is etched by the use of a chemical species produced by preparing a dry etching gas containing a halogen-containing gas and an oxygen-containing gas and supplying a plasma excitation power to the dry etching gas to thereby excite plasma. The thin film is etched using, as the plasma excitation power, a power lower than a plasma excitation power at which plasma density jump occurs.

25 Claims, 4 Drawing Sheets

U.S. PATENT DOCUMENTS

| | | | |
|---|---|---|---|
| 6,790,671 B1 * | 9/2004 | Austin et al. | 436/172 |
| 6,913,706 B2 * | 7/2005 | Yan et al. | 216/24 |
| 2001/0006753 A1 | 7/2001 | Inoue | |
| 2004/0058252 A1 * | 3/2004 | Mathuni et al. | 430/5 |
| 2004/0124174 A1 * | 7/2004 | Yan et al. | 216/54 |
| 2005/0161589 A1 * | 7/2005 | Kim et al. | 250/216 |
| 2005/0161749 A1 * | 7/2005 | Yang et al. | 257/414 |
| 2005/0181608 A1 * | 8/2005 | Stoeher et al. | 438/689 |

FOREIGN PATENT DOCUMENTS

| | | | |
|---|---|---|---|
| JP | 07-094468 A | 4/1995 | |
| JP | 09-279367 A | 10/1997 | |
| JP | 10-107013 A | 4/1998 | |
| JP | 2000-214575 A | 8/2000 | |
| JP | 2001-135617 A | 5/2001 | |
| JP | 2001-183809 A | 7/2001 | |
| KR | 2000-0057762 A | 9/2000 | |
| WO | 01/96955 A2 | 12/2001 | |

OTHER PUBLICATIONS

Hyuk-Joo Kwon, Kwang-Sik Oh, Byung-Soo Chang, Boo-Yean Choi, Kyung-Ho Park, Soo-Hong Jeong; Dry Etching Technology of Cr and MoSi Layers Using High-Density Plasma Source; Proc. SPIE vol. 4186 (2001, no month), pp. 532-539.*

James A. Reynolds, et al., Proceedings of SPIE: 17th Annual Symposium on Photomask Technology and Management, Sep. 17-19, 1997, vol. 3236, pp. 94-103.

Hideo Sugai, Production and Physics of High Density Plasmas, Journal of Sputtering & Plasma Processes, vol. 13, No. 4, Oct. 9, 1998, Japan.

* cited by examiner

FIG. 7 PRIOR ART

| 0.2 μm | 0.3 μm | 0.4 μm | 0.5 μm |
|---|---|---|---|
| No Data | | | |
| | | | |

METHOD FOR ETCHING CHROMIUM THIN FILM AND METHOD FOR PRODUCING PHOTOMASK

TECHNICAL FIELD

The present invention relates to a method of dry etching a chromium-based thin film and, in particular, to a method of dry etching a light-shielding film comprising a chromium-based thin film, which method is carried out in a method of manufacturing a photomask used in semiconductor device manufacturing or the like. Further, the present invention relates to a method of manufacturing a photomask, which method includes a step of dry etching a light-shielding film comprising a chromium-based thin film.

BACKGROUND ART

For example, following development of a higher degree of integration of a semiconductor integrated circuit or the like, a photomask used in a micromachining process contained in a semiconductor manufacturing process is required to have a high pattern accuracy.

In photomasks currently used, a chromium-based material is generally used as a light-shielding film in view of machinability of a high-accuracy pattern.

However, such a demand for a higher-resolution pattern of the photomask following the development of a higher degree of integration of the semiconductor integrated circuit can not be met by an existing patterning method of patterning a chromium-based light-shielding film using a resist pattern as an etching mask. It has been revealed that, in this method, as a fine opening pattern (hole) has a higher resolution, an influence of degradation in size and shape of the fine opening pattern (hole) due to a microloading effect can not be neglected and becomes an obstacle in practical use.

Specifically, as the existing patterning method of patterning the chromium-based light-shielding film by the use of the resist pattern as the etching mask, use is mainly made of a method of forming a Cr pattern by dry etching using a gas composition predominantly containing a $Cl_2+O_2$ mixed gas and using a resist pattern on a Cr film as a mask (see Japanese Unexamined Patent Application Publication (JP-A) No. 2001-183809).

For the dry etching, an RIE (Reactive Ion Etching) apparatus is typically used. However, in order to meet the recent demand for finer patterns and a higher pattern accuracy, an ICP (Inductive Coupling Plasma) system is considered (see "SPIE", Vol. 3236, C. Constantine et al, 1997, pp. 94-103, hereinafter referred to as the first prior art).

In this case, etching is generally performed at a high plasma density using an ICP power higher than an ICP power which causes electron density jump (i.e., a condition achieving stable plasma discharge) (see Journal of "SPUTTERING & PLASMA PROCESSES", Vol. 13, No. 4 (entitled: "Production and Physics of High-Density Plasma", written by: Hidero Sugai, p. 7), Oct. 9, 1998, published by Sputtering and Plasma Technology Department of Japan Technology Transfer Association, hereinafter referred to as the second prior art).

However, the first and the second prior arts mentioned above have three problems which will be described hereinunder.

As a first problem, there is a large difference in size between a resist pattern after development and a Cr pattern after etching (hereinafter referred to as a conversion difference between a resist and Cr or simply as a conversion difference). Heretofore, use has been made of a method in which development and etching conditions anticipating the conversion difference are adopted to improve an accuracy with respect to designed pattern data.

However, in recent years, a pattern having a fine and complicated shape, such as an optical proximity correction (OPC) pattern, is used. Further, there is a demand for high-accuracy formation of a pattern having a size difference and a density difference in a mask plane. Under the circumstances, it is difficult to form a high-accuracy pattern by using the existing method.

Specifically, Cr recession by isotropic etching of the resist causes the following problem. Comparing square patterns of the same size, the square opening pattern (removed portion) is increased in size and its corners are rounded. On the other hand, the square shielding pattern (remaining portion or Cr portion) is decreased in size and its corners are kept at substantially right angles. This results in differences in size and in corner shape between these patterns.

The above-mentioned problem exerts the following influence on a mask manufacturing process and a mask quality. First, the corners of the square opening pattern being rounded induces occurrence of a suspected defect, resulting in a serious obstacle to an inspection process. Further, the pattern shape is not formed in exact conformity with designed pattern data, resulting in reduction in margin in a lithography process in a semiconductor manufacturing process and a large number of steps required in condition setting. Further, the above-mentioned conversion difference becomes an obstacle to fine pattern formation on the mask. It is possible to accommodate the above-mentioned conversion difference by data sizing. In this case, however, the sizing amount increases so that a conversion time increases.

As a second problem, because of the microloading effect, the conversion difference between the resist and Cr widely changes depending on the size of the opening pattern (hole). As the opening pattern is a finer opening pattern having a smaller size, a finished size is smaller and the conversion difference has a greater absolute value. The relationship of a shift amount from a designed pattern size with respect to a change in designed pattern size is called CD linearity. If a change in shift amount from the designed pattern size is large with respect to the change in designed pattern size, the expression that the CD linearity is inferior is used.

The change in shift amount from the designed pattern size being large with respect to the change in designed pattern size represents that variation in conversion difference between the resist and Cr is large. This problem exerts the following influence on the mask manufacturing process and the quality.

At first, because of this problem, the conversion difference varies depending on the size of the opening pattern so that CD accuracy (particularly, the CD linearity) is degraded. This results in reduction in margin in the lithography process in the semiconductor manufacturing process and a large number of steps required in condition setting. The reason is as follows. Although the CD accuracy may be compensated by another process such as exposure, a condition therefor may not be an optimal condition considering other CD accuracy than the CD linearity.

As a third problem, the sectional shape of Cr depends on the size of the opening pattern (hole). If the opening pattern is decreased in size to become a fine opening pattern, the sectional shape is tapered. This problem exerts the following influence on the mask manufacturing process and the quality.

At first, because of this problem, the sectional shape of Cr may be changed in the plane. In this event, due to an electromagnetic optical effect, an optical size variation as large as several times a variation resulting from the sectional shape is caused to occur. This results in reduction in margin in the lithography process in the semiconductor manufacturing process and a large number of steps required in condition setting. Further, in case where the length of the mask is measured by an optical length meter, length measurement accuracy is degraded.

It is therefore a first object of the present invention to provide a method of manufacturing a photomask, which is capable of reducing a conversion difference regardless of the shape of a pattern (opening pattern (hole), light shielding pattern (dot), line and space, etc.), a size difference, or a density difference (particularly regardless of hole or dot) and of reducing a difference in shape between a hole or a dot.

It is a second object of the present invention to provide a method of manufacturing a photomask having excellent CD linearity (constant conversion difference) even if a hole has a small size.

It is a third object of the present invention to provide a method of manufacturing a photomask in which the sectional shape of a hole does not depend upon the size and is excellent even if the size is small.

DISCLOSURE OF THE INVENTION

The present invention has the following aspects.

(First Aspect)

A method of etching a chromium-based thin film, the method being for processing an object comprising the chromium-based thin film made of a material containing chromium, the thin film being etched using a resist pattern as a mask, the thin film being etched by the use of a chemical species produced by preparing a dry etching gas containing a halogen-containing gas and an oxygen-containing gas and supplying a plasma excitation power to the dry etching gas to thereby excite plasma, wherein:

the thin film is etched using, as the plasma excitation power, a power lower than a plasma excitation power at which plasma density jump occurs.

(Second Aspect)

The method of etching a chromium-based thin film according to the first aspect, wherein the halogen-containing gas is a chlorine-containing gas.

(Third Aspect)

The method of etching a chromium-based thin film according to the first aspect, wherein the dry etching gas further contains helium.

(Fourth Aspect)

The method of etching a chromium-based thin film according to the first aspect, wherein the thin film is etched while supplying at least a part of the chemical species to the thin film in a direction perpendicular to the thin film so that the thin film is etched while an organic substance is deposited on a side wall of the resist pattern being etched by an isotropic etching component.

(Fifth Aspect)

The method of etching a chromium-based thin film according to the fourth aspect, wherein at least a part of the chemical species is supplied to the thin film in the direction perpendicular to the thin film by applying a high-frequency power to the object.

(Sixth Aspect)

The method of etching a chromium-based thin film according to the fourth aspect, wherein at least a part of the chemical species is supplied to the thin film in the direction perpendicular to the thin film so that an etching selectivity between the resist pattern and the thin film (thin film etch rate/resist pattern etch rate) is smaller than 1.5.

(Seventh Aspect)

The method of etching a chromium-based thin film according to the first aspect, wherein a resist layer of the resist pattern has a coverage of 70% or more with respect to the thin film.

(Eighth Aspect)

The method of etching a chromium-based thin film according to the first aspect, wherein the thin film is etched in presence of an organic substance other than the resist pattern if a resist layer of the resist pattern has a coverage smaller than 70% with respect to the thin film.

(Ninth Aspect)

A method of etching a chromium-based thin film, the method being for processing an object comprising the chromium-based thin film made of a material containing chromium, the thin film being etched using a resist pattern as a mask, the thin film being etched by the use of a chemical species produced by preparing a dry etching gas containing a halogen-containing gas and an oxygen-containing gas and supplying a plasma excitation power to the dry etching gas to thereby excite plasma, wherein:

the thin film is etched in presence of an organic substance other than the resist pattern while supplying at least a part of the chemical species to the thin film in a direction perpendicular to the thin film, so that the thin film is etched while an organic product is deposited on a side wall of the resist layer being etched by an isotropic etching component.

(Tenth Aspect)

The method of etching a chromium-based thin film according to the ninth aspect, wherein the halogen-containing gas is a chlorine-containing gas.

(Eleventh Aspect)

The method of etching a chromium-based thin film according to the ninth aspect, wherein the presence of the organic substance other than the resist pattern is established by adding an organic gas to the dry etching gas as the organic substance other than the resist pattern.

(Twelfth Aspect)

The method of etching a chromium-based thin film according to the eleventh aspect, wherein the amount of the organic gas is 30 vol % or less of the dry etching gas.

(Thirteenth Aspect)

The method of etching a chromium-based thin film according to the eleventh aspect, wherein the organic gas is ethanol.

(Fourteenth Aspect)

The method of etching a chromium-based thin film according to the ninth aspect, wherein an organic polymer material is disposed in an etching chamber as the organic substance other than the resist pattern.

(Fifteenth Aspect)

The method of etching a chromium-based thin film according to the ninth aspect, wherein the thin film is etched using, as the plasma excitation power, a power lower than a plasma excitation power at which plasma density jump occurs.

(Sixteenth Aspect)

The method of etching a chromium-based thin film according to the fifteenth aspect, wherein the dry etching gas further contains helium.

(Seventeenth Aspect)

The method of etching a chromium-based thin film according to the first or the ninth aspect, wherein the object is a photomask blank comprising a transparent substrate and a light-shielding film made of a material containing chromium and formed on the transparent substrate.

(Eighteenth Aspect)

A method of manufacturing a photomask from a photomask blank comprising a transparent substrate and a light-shielding film made of a material containing chromium and formed on the transparent substrate, the method comprising a step of etching the light-shielding film by the use of a resist layer in a resist pattern as a mask, wherein:

the step of etching the light-shielding film is carried out using the method of etching a chromium-based thin film according to the seventeenth aspect.

(Nineteenth Aspect)

The method of manufacturing a photomask according to the eighteenth aspect, wherein, by etching the light-shielding film, a pattern including an optical proximity correction (OPC) pattern is formed.

(Twentieth Aspect)

The method of manufacturing a photomask according to the eighteenth aspect, wherein, by etching the light-shielding film, a pattern including a pattern of which a design size is 0.4 μm or more and 2.0 μm or less and of which a CD linearity error is 15 nm or less is formed.

BRIEF DESCRIPTION OF THE DRAWINGS

FIG. 7 is a diagram for explaining sectional shapes of patterns obtained in the examples and the comparative example.

BEST MODE FOR CARRYING OUT THE INVENTION

First Embodiment

Figure 1:
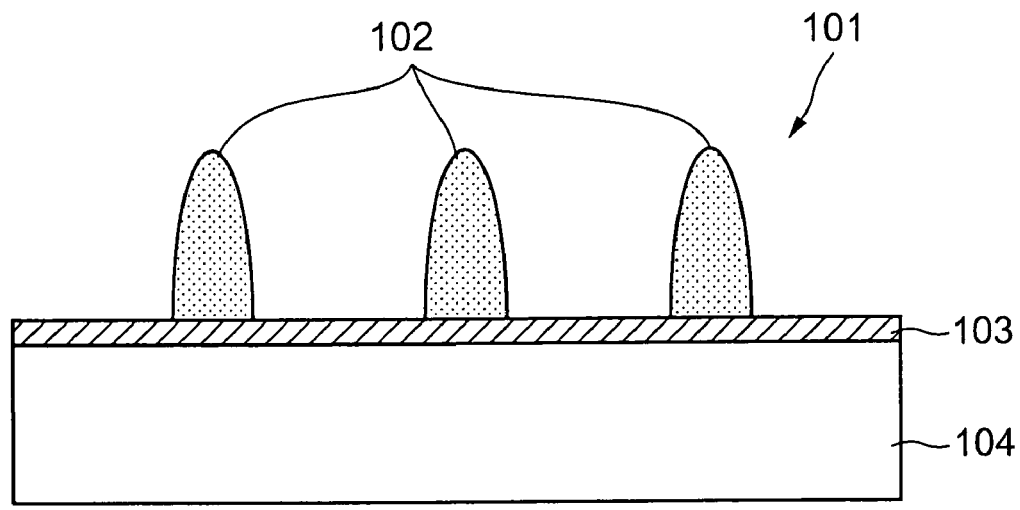
FIG. 1 is a schematic sectional view for explaining a mask substrate provided with a resist pattern, as an object of etching in examples of this invention.

In a first embodiment of the present invention, upon etching a chromium-based thin film made of a material containing chromium by the use of a resist pattern as a mask, etching is carried out by the use of a chemical species produced by preparing a dry etching gas comprising a mixed gas containing a halogen-containing gas and an oxygen-containing gas and supplying a plasma excitation power to the dry etching gas to thereby excite plasma. As the plasma excitation power, a power lower than a plasma excitation power at which plasma density jump occurs is used.

For example, in case of the ICP system, the plasma excitation power is ICP power. As regards the plasma density jump, the above-mentioned second prior art describes the relationship between a plasma electron density and the ICP power. When the ICP power increases, the plasma electron density tends to increase and, at a certain ICP power, density jump occurs as a phenomenon that the plasma electron density rapidly increases. In the present invention, the plasma excitation power at which the plasma density jump occurs represents the plasma excitation power at which the plasma density rapidly increases as described above.

In the prior art, lowering the ICP power causes the tendency of unstable plasma discharge and, therefore, is not adopted. However, the present inventor has found out that, in order to reduce a conversion difference, it is necessary to control the amount of radicals promoting isotropic etching of a pattern to thereby promote the etching of a side wall and that, for this purpose, a method of setting a low plasma excitation power to thereby reduce the plasma density is effective. Further, when the dry etching is performed, temperature rise of an object to be processed generally occurs. In this event, the temperature rise of the object is greater as the plasma excitation power is greater.

The temperature rise of the object is also a factor promoting the isotropic etching. Therefore, if the temperature rise of the object is suppressed by the use of the low plasma excitation power as in the present invention, it is possible to suppress promotion of the isotropic etching. If temperature control of the object is difficult, for example, in case of an object made of a material having a low heat conductivity, such as a glass substrate of a photomask blank, it is possible to suppress the temperature rise of the object by the method of the present invention without performing temperature control for preventing the temperature of the object from rising to a high temperature during the etching.

Specifically, for example, in the case of the ICP system, the ICP power is set within a low ICP power range of 200 W to 300 W. In this manner, it is possible to obtain a photomask in which a variation in conversion difference between a resist and Cr (pattern linearity) relative to a change in size of an opening pattern is 15 nm or less (not greater than a half of the prior art) with respect to the opening pattern of 0.4 to 2.0 μm. As a result, it is prevented that the conversion difference between the resist and Cr widely changes depending on the size of the opening pattern (hole) (as the size of the opening pattern is smaller, the finished size is smaller).

Further, it is possible to remarkably improve the problem that the sectional shape of Cr depends on the size of the opening pattern (hole) and, as the size of the opening pattern is smaller, the sectional shape is tapered. In view of achieving more stable plasma discharge, the ICP power is preferably higher than 200 W. On the other hand, in view of improving the linearity, the ICP power is preferably lower than 300 W. From the above, the ICP power is set within a low ICP power range preferably between 220 W and 280 W, more preferably between 240 W and 260 W.

In order to stabilize the plasma discharge with a low plasma excitation power, it is proposed to improve a plasma apparatus. Besides, proposal is also made of a method of optimizing dry etching conditions such as a gas pressure and a gas flow rate. With respect to the optimization of the dry etching conditions, it is necessary to take into account the balance with other properties (selectivity, etching uniformity, etc.).

In the present invention, as a method having a least adverse influence on the other properties, He is added into a dry etching gas as a gas contributing to stabilization of plasma discharge. Further, it has been confirmed that He has an effect of reducing the microloading effect. It has also been confirmed that, if a greater amount of He is added, the plasma discharge is more stabilized but, if the amount is excessively large, the linearity of the pattern is degraded. In view of the above, the content of He in the dry etching gas is preferably 1 to 20 vol % or less, more preferably 5 to 15 vol %.

In the present invention, the dry etching is carried out while at least a part of the chemical species produced by plasma excitation of the dry etching gas is supplied to the thin film in a direction perpendicular to the thin film. In this manner, the etching is carried out while depositing an organic substance on the side wall of the resist pattern etched by an isotropic etching component. As a result, it is possible to effectively suppress a change in size of the resist pattern during the dry etching.

Specifically, by supplying at least a part of the chemical species to the thin film in the direction perpendicular to the thin film, a sputter etching component due to the chemical species supplied in the direction perpendicular to an etched surface is increased. As a consequence, the resist pattern is removed from above. A removed resist is vaporized to produce an organic product which is then deposited on the side wall of the resist pattern etched by the isotropic etching component. Thus, the etching and the deposition are cancelled by each other to thereby reduce the variation in size. It is supposed that the deposition of the organic product occurs isotropically. However, it is also supposed that the organic product deposited on the etched surface of the thin film is removed by sputtering by an anisotropic sputter etching component.

As means for supplying at least a part of the chemical species to the thin film in the direction perpendicular to the thin film, use may be made of a method of applying a high-frequency power (RF bias) to the object. A power supply for applying the RF bias is generally separate from a power supply for supplying the plasma excitation power. Typically, the plasma excitation power is as large as about 10 times the RF bias or more.

In the above-mentioned method, in order to cancel the etching and the deposition with each other, it is necessary to consider the balance between the etching and the deposition. In order to assure the deposition amount relative to the etching, a certain amount of the organic product produced by vaporization of the removed resist is required. In the present invention, it has been found out that, by supplying at least a part of the chemical species to the thin film in the direction perpendicular to the thin film so that the etching selectivity between the resist pattern and the thin film (etching rate of thin film/etching rate of resist layer) is as low as less than 1.5, it is possible to produce the organic product in an amount sufficient to cancel the etching. In case where the RF bias is used, the above can be realized by setting the RF bias to be relatively high. It is noted here that the etching selectivity is set so that the resist pattern of a minimum essential amount is left during the etching of the thin film.

If the coverage of the resist layer relative to the thin film is 70% or more, the organic product of a sufficient amount can be produced. However, if the coverage of the resist is smaller, the organic substance to be deposited may be insufficient. In view of the above, the thin film is etched in presence of an organic substance other than the resist pattern so as to deposit an organic reaction product produced from the organic substance. In this manner, it is possible to establish the balance at which the etching and the deposition are cancelled by each other.

As a method of establishing the presence of the organic substance other than the resist pattern, use may be made of, for example, a method of adding an organic gas to the dry etching gas or a method of disposing an organic polymer material in the dry etching apparatus. As the organic substance, a gas containing halogen such as Cl is used as the dry etching gas. In order to avoid the adverse influence on the etching of Cr as a result of mixing another halogen, it is preferable that the organic substance does not contain a halogen element other than that used in the dry etching. If chlorine is used as the dry etching gas, use is preferably made of an organic gas which does not contain F, Br, I, or At as a component (or in a molecule).

Second Embodiment

In a second embodiment of the present invention, upon etching a chromium-based thin film made of a material containing chromium by the use of a resist pattern as a mask, etching is carried out by the use of a chemical species produced by preparing a dry etching gas comprising a mixed gas containing chlorine and oxygen and supplying a plasma excitation power to the dry etching gas to thereby excite plasma. The thin film is etched in presence of an organic substance other than the resist pattern while supplying at least a part of the chemical species to the thin film in a direction perpendicular to the thin film. Thus, the etching is carried out while depositing an organic product on a side wall of a resist layer etched by an isotropic etching component.

According to the second embodiment of the present invention, the dry etching is performed in presence of the organic substance other than the resist pattern while supplying at least a part of the chemical species to the thin film in the direction perpendicular to the thin film. In this manner, the organic product produced from the organic substance and the organic product produced by vaporization of the resist removed by the sputter-etching component generated by supplying at least a part of the chemical species to the thin film in the direction perpendicular to the thin film, i.e. the sputter-etching component due to the chemical species supplied in the direction perpendicular to the etched surface, are deposited on the side wall of the resist pattern etched by the isotropic etching component. In this manner, the etching and the deposition are cancelled by each other to thereby reduce the variation in size.

It is supposed that the deposition of the organic products occurs isotropically. However, it is also supposed that the organic products deposited on the etched surface of the thin film are removed by sputtering by an anisotropic sputter-etching component. In the above-mentioned method, in order to cancel the etching and the deposition with each other, various dry etching conditions are optimized taking into account the coverage of the resist layer relative to the thin film. Thus, it is possible to achieve the balance between the etching and the deposition.

As a method of establishing the presence of the organic substance other than the resist pattern, use may be made of, for example, a method of adding an organic gas to the dry etching gas or a method of disposing an organic polymer material in the dry etching apparatus. As the organic substance, a gas containing halogen such as Cl is used as the dry etching gas. In order to avoid the adverse influence on the etching of Cr as a result of mixing another halogen, it is preferable that the organic substance does not contain a halogen element other than that used in the dry etching. If chlorine is used as the dry etching gas, use is preferably made of an organic gas which does not contain F, Br, I, or At as a component (or in a molecule).

The method of adding the organic gas to the dry etching gas is preferable because a desired conversion difference can be set for a mask having any desired resist coverage by controlling a kind and an amount of the organic gas to be added. Further, the amount of the organic gas to be added is preferably 30 vol % or less relative to an entire volume of the mixed gas containing chlorine and oxygen in view of controllability of the etching rate of Cr and in view of avoiding unnecessary and excessive deposition of the organic substance in an etching chamber.

As the organic gas, use may be made of alcohol such as ethanol, methane, ethane, acetone, vinyl chloride, and hydrogen cyanide. Particularly, use of ethanol is preferable in order to solve the aforementioned three problems on a practical level and in order to solve the problem of the influence of degradation in size and shape of the fine opening pattern (hole) due to the microloading effect and to thereby remove the obstacle in practical use.

As the method of disposing the organic polymer material in the dry etching apparatus, use may be made of a method of using the organic polymer material for an electrode cover or the like.

Further, as the plasma excitation power upon etching the thin film, a power lower than a plasma excitation power at which plasma density jump occurs is used. In this manner, the plasma density is decreased and the temperature rise of the object is suppressed so that the isotropic etching is suppressed. As a result, the balance between the etching and the deposition at the side wall of the resist pattern can easily be achieved. In this case, it is preferable to add He to the dry etching gas in order to stabilize the plasma.

The first and the second embodiments mentioned above are suitably applied to dry etching of a light-shielding film made of a material containing chromium and included in a photomask blank in order to manufacture a photomask for which formation of a high-accuracy pattern is required in recent years.

Herein, the chromium-based thin film or the thin film made of the material containing chromium also includes a thin film containing chromium and another element or elements. For example, the thin film may be Cr alone, CrO (meaning that chromium and oxygen are contained without defining the contents thereof, the same also applies hereinafter), CrN, CrC, CrCO, CrCN, CrON, CrCON, and so on. The thin film may have any layer structure such as a single-layer film having a uniform composition, a plurality of layers different in composition in a film thickness direction, a composition-gradient layer varied in composition in a film thickness direction, and so on.

The present invention is extremely effective in reducing pattern linearity with respect to formation of a pattern including an optical proximity correction (OPC) pattern as a pattern having a fine and complicated shape.

By applying the method of the present invention, it is possible to extremely reduce a change in conversion difference between the resist and Cr with respect to a change in size of the opening pattern so that the CD linearity can be remarkably improved as compared with the prior art. As a consequence, it is possible to obtain a photomask in which, with respect to an opening pattern of 0.4 µm or more, the change in conversion difference between a resist and Cr relative to the change in size of the opening pattern (pattern linearity) is 15 nm or less. This photomask is a first one succeeded in very effectively solving the problem of the influence of degradation in size and shape of the fine opening pattern (hole) due to the microloading effect to thereby remove the obstacle in practical use. Therefore, such aspect is defined. From the same point of view, with respect to the opening pattern of 0.4 µm or more, the change in conversion difference between the resist and Cr relative to the change in size of the opening pattern (pattern linearity) is preferably 10 nm or less, more preferably 5 nm or less.

In the present invention, as a dry etching method, RIE, MERIE, ICP, NLD, or a method using various methods may be used. Among others, it is preferable to use the ICP which is an optimum etching method for the chromium-based thin film.

Further, in the present invention, $Cl_2$ is most popular as the halogen-containing gas used as the dry etching gas. However, use may be made of $SiCl_4$, HCl, $CCl_4$, $CHCl_3$, or the like. In addition, a gas containing bromine or iodine may also be used. As the oxygen-containing gas, $O_2$ is most popular. However, $CO_2$, CO, or the like may be used also.

EXAMPLE 1

First, FIG. 1 shows a mask substrate 101 provided with a resist pattern, which is an object of etching in this example. The mask substrate 101 has a layered structure comprising a resist pattern 102 having a thickness of 400 nm, a Cr-based film (representing a film made of a material containing Cr; the same also applies hereinafter) 103 having a thickness of 100 nm, and a glass substrate (synthetic quartz substrate or the like) 104. As the resist pattern 102, a photoresist or an EB resist is used depending on an exposure apparatus to be used. In either case, each side wall of the resist pattern is approximately vertical in section. The resist pattern 102 covers 80% or more of an area of the Cr-based film 103.

Figure 2:
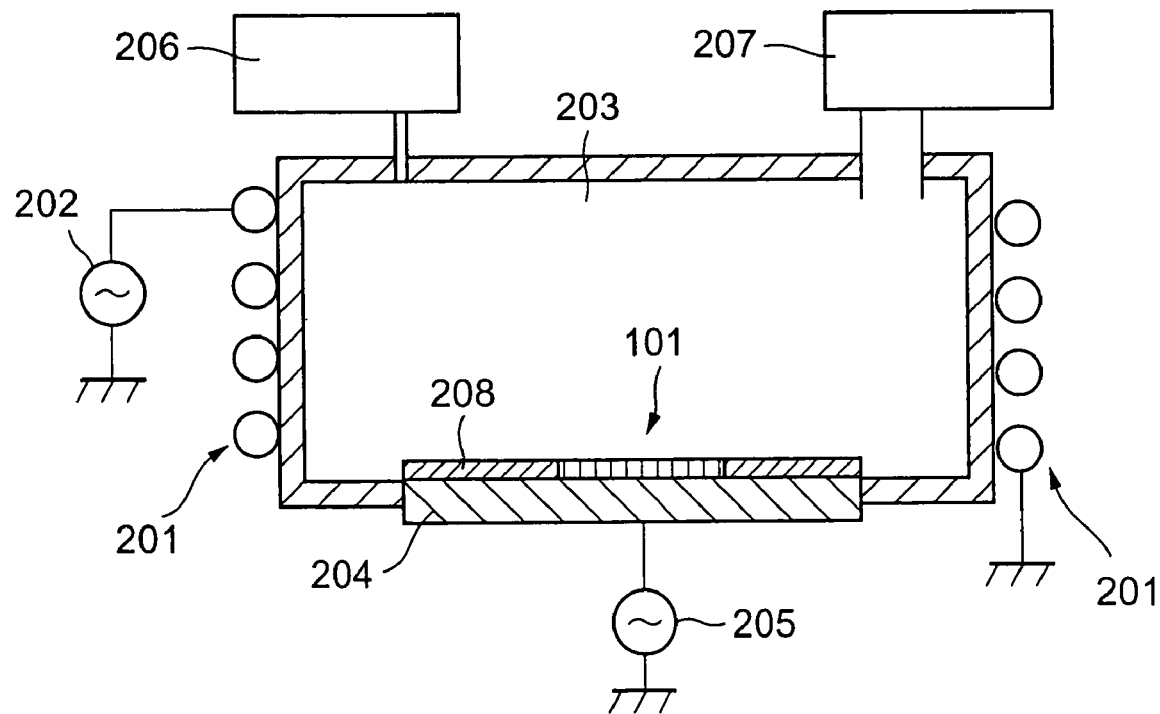
FIG. 2 is a schematic diagram for explaining a general structure of an etching apparatus used in the examples.

Next, FIG. 2 shows a structure of an etching apparatus (of an inductive coupling plasma (ICP) system) used in this example.

This apparatus comprises a plasma generation coil 201, a coil-energizing RF power supply 202, a vacuum chamber (hereinafter referred to as a chamber) 203, an RF electrode 204, an RF electrode-energizing RF power supply 205, a gas introduction system 206, an evacuation system 207, and an RF electrode cover 208 (a cover member covering a remaining portion except a portion where the substrate 101 is placed). The apparatus does not have a mechanism for controlling the mask substrate 101 at a constant temperature during etching.

In the above-mentioned apparatus, the mask substrate 101 is placed on the RF electrode 204 and the chamber 203 is held in a high vacuum by the evacuation system 207 in advance. The chamber 203 is supplied from the gas supply system 206 with a mixed gas of chlorine, oxygen, and helium ($Cl_2:O_2:$He=160:40:20 [sccm]). A desired pressure (2 Pa) is kept by adjusting a displacement of the evacuation system 207. A high-frequency power (ICP power) is supplied to the plasma generation coil 201 from the coil-energizing RF power supply 202 to thereby produce plasma within the chamber 203. The high-frequency power (ICP power) supplied herein has a value (200 W to 300 W, 210 W in this example) smaller than a high-frequency power (ICP power) at which electron density jump occurs and which is near to a discharge limit.

After the plasma is stabilized, a high-frequency power (RF bias) is quickly supplied to the RF electrode from the RF electrode-energizing RF power supply 205. The high-frequency power is set to be relatively high so that the etching selectivity between the resist and Cr (Cr etching rate/resist etching rate) (hereinafter referred to simply as the selectivity) is smaller than 1.5. It is noted here that the high-frequency power supplied from the coil-energizing RF power supply 202 is 10 times or more the high-frequency power supplied from the RF electrode-energizing RF power supply 205. The RF bias has a value preferably between 10 W and 20 W and is set to 20 W in this example. He is added for the purpose of stabilizing the plasma discharge and improving the microloading effect. After the etching of Cr is finished, overetching is appropriately performed. Then, the etching is completed.

In this example 1, the etching can be carried out in the state where the plasma density is low. As a result, it is possible to achieve an effect of reducing the density of radicals contributing to isotropic etching of the resist and an effect of suppressing the rise of the substrate temperature. Thus, the etching amount in a lateral direction of the resist is suppressed.

In addition to the above-mentioned effect of suppressing the etching amount of the resist in the lateral direction, which is achieved by performing the etching in the state where the plasma density is low, the RF bias is set to be relatively high in this example 1 so that the substrate with the resist pattern of a high coverage (80% or more) is etched at a low selectivity smaller than 1.5 as the etching selectivity between the resist and Cr (Cr etching rate/resist etching rate). Thus, a large amount of organic gas is emitted into the chamber so that an effect of suppressing the isotropic etching of the resist by isotropic deposition of the organic gas is exhibited synergistically. As a result, the aforementioned three problems can be solved quite effectively on a practical level.

Specifically:

(1) Regardless of the shape (hole, dot, line and space, etc.) and the size of a pattern (particularly regardless of hole or dot), a conversion difference can be reduced and a difference in shape between a hole and a dot can be reduced.

(2) The linearity is excellent (conversion difference is constant) even if the size of a hole is small.

(3) A photomask is obtained in which the sectional shape of a hole does not depend on the size thereof and, even if the size is small, the verticalness is excellent.

In the example 1, regardless of the shape (hole, dot, line and space, etc.) and the size of a pattern, a CD linearity error is 8 nm or less for the size of 0.4 μm to 2.0 μm. Thus, the very excellent CD linearity can be realized.

Further, the example 1 does not require special reconstruction of the apparatus as in an example 2 (addition of an organic gas system) or an example 3 (reconstruction of the chamber) which will later be described.

EXAMPLE 2

First, FIG. 1 shows a mask substrate 101 provided with a resist pattern, which is an object of etching in this example.

The mask substrate 101 has a layered structure comprising a resist pattern 102 having a thickness of 400 nm, a Cr-based film 103 having a thickness of 100 nm, and a glass substrate (synthetic quartz substrate or the like) 104. As the resist pattern 102, a photoresist or an EB resist is used depending on an exposure apparatus to be used. In either case, each side wall of the resist pattern is approximately vertical in section. The resist pattern 102 covers 10% of an area of the Cr-based film 103.

Next, FIG. 2 shows a structure of an etching apparatus used in this example.

This apparatus comprises a plasma generation coil 201, a coil-energizing RF power supply 202, a chamber 203, an RF electrode 204, an RF electrode-energizing RF power supply 205, a gas introduction system 206, an evacuation system 207, and an RF electrode cover 208 (covering a remaining portion except a portion where the substrate 101 is placed). The apparatus does not have a mechanism for controlling the mask substrate 101 at a constant temperature during etching.

The difference from the example 1 and the example 3 resides in that the gas introduction system has a function of supplying an organic gas (ethanol is used in this example) in addition to chlorine and oxygen.

In the above-mentioned apparatus, the mask substrate 101 is placed on the RF electrode 204 and the chamber 203 is held in a high vacuum by the evacuation system 207 in advance. The chamber 203 is supplied from the gas supply system 206 with a mixed gas of chlorine, oxygen, helium, and an organic gas (ethanol in this example) ($Cl_2:O_2$:He:ethanol=160:40:20: 20 [sccm] (accordingly, the ratio of ethanol is about 8 vol %)). A desired pressure is kept by adjusting a displacement of the evacuation system 207. A high-frequency power (ICP power) is supplied to the plasma generation coil 201 from the coil-energizing RF power supply 202 to thereby produce plasma within the chamber 203. The high-frequency power (ICP power) supplied herein has a value smaller than a high-frequency power (ICP power) at which electron density jump occurs. Specifically, a value within a range (240 W to 300 W) considering the uniformity and the stability of plasma is used. In this example, the value is 250 W.

After the plasma is stabilized, a high-frequency power is quickly supplied to the RF electrode from the RF electrode-energizing RF power supply 205. Unlike the example 1, the high-frequency power need not be set so that the Cr/resist selectivity is low. Therefore, it is sufficient to set the high-frequency power in a condition such that Cr/resist etching characteristics (pattern shape etc.) are excellent, and a value lower than that in the example 1 is sufficient. Herein, the high-frequency power is set in a condition such that the Cr/resist selectivity is equal to 1.7. After the etching of Cr is finished, overetching is appropriately performed. Then, the etching is completed.

In this example 2, the etching can be carried out in the state where the plasma density is low. As a result, it is possible to achieve an effect of reducing the density of radicals contributing to isotropic etching of the resist and an effect of suppressing the rise of the substrate temperature. Thus, the isotropic etching amount of the resist is suppressed.

In addition to the above-mentioned effect of suppressing the etching amount of the resist in a lateral direction, which is achieved by performing the etching in the state where the plasma density is low, the organic gas is independently added in this example 2 so that an effect of suppressing the etching amount of the resist in the lateral direction by isotropic deposition of the organic gas is exhibited synergistically. As a result, the aforementioned three problems can be solved quite effectively on a practical level.

Specifically:

Regardless of the shape (hole, dot, line and space, etc.) and the size of a pattern (particularly regardless of hole or dot), a conversion difference can be reduced and a difference in shape between a hole and a dot can be reduced.

The linearity is excellent (conversion difference is constant) even if the size of a hole is small.

A photomask is obtained in which the sectional shape of a hole does not depend on the size thereof and, even if the size is small, the verticalness is excellent.

In the example 2, regardless of the shape (hole, dot, line and space, etc.) and the size of a pattern, a CD linearity error is 8 nm or less for the size of 0.41 μm to 2.0 μm. Thus, the very excellent CD linearity can be realized.

The example 2 is superior to the above-mentioned example 1 in the following respects.

(1) Since the organic gas is independently added, a greater amount of the organic substance can be produced. As a result, it is possible to set a relatively high plasma density as compared with the example 1. This leads to an advantage that a state where the uniformity and the stability of the plasma are excellent can be selected.

(2) Since the organic gas produced from the resist is not relied upon, no limitation is imposed upon the coverage of the resist pattern and the selectivity. Therefore, this example is applicable to masks of any (all) patterns.

(3) In the organic gas density within the chamber, distribution caused by a mask pattern hardly occur.

Further, the example 2 is superior in the following respects to an example 3 which will later be described.

(1) No variation in characteristics is caused due to time-dependent change of the electrode material.

(2) Reconstruction of the chamber is not necessary.

EXAMPLE 3

First, FIG. 1 shows a mask substrate 101 provided with a resist pattern, which is an object of etching in this example.

The mask substrate 101 has a layered structure comprising a resist pattern 102 having a thickness of 400 nm, a Cr-based film 103 having a thickness of 100 nm, and a glass substrate (synthetic quartz substrate or the like) 104. As the resist pattern 102, a photoresist or an EB resist is used depending on an exposure apparatus to be used. In either case, each side wall of the resist pattern is approximately vertical in section. The resist pattern 102 covers 10% of an area of the Cr-based film 103.

Figure 3:
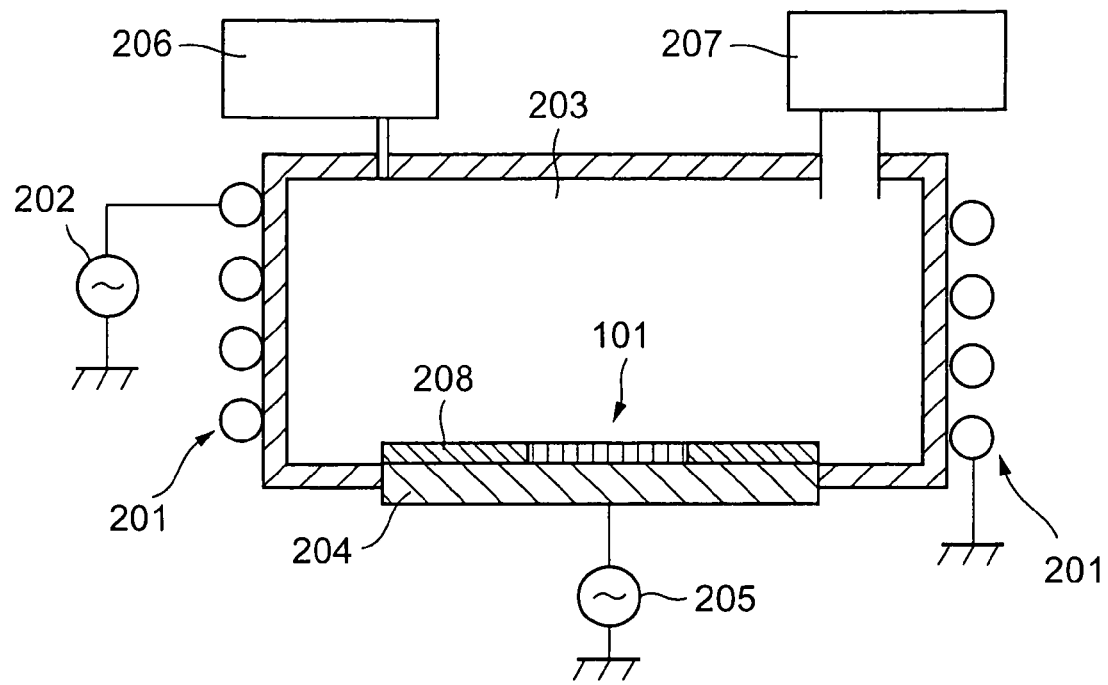
FIG. 3 is a schematic diagram for explaining a modification of the etching apparatus used in the examples.

Next, FIG. 3 shows a structure of an etching apparatus used in this example.

This apparatus comprises a plasma generation coil 201, a coil-energizing RF power supply 202, a chamber 203, an RF electrode 204, an RF electrode-energizing RF power supply 205, a gas introduction system 206, an evacuation system 207, and an RF electrode cover 208 (cover member covering a remaining portion other than a portion where the substrate 101 is placed). The apparatus does not have a mechanism for controlling the mask substrate 101 at a constant temperature during etching.

The difference from the example 1 and the example 2 resides in that a material of the RF electrode cover 208 is an organic polymer (polystyrene in this example).

In the above-mentioned apparatus, the mask substrate 101 is placed on the RF electrode 204 and the chamber 203 is held in a high vacuum by the evacuation system 207 in advance. The chamber 203 is supplied from the gas supply system 206 with a mixed gas of chlorine, oxygen, and helium ($Cl_2$:$O_2$:He=160:40:20 [sccm]). A desired pressure is kept by adjusting a displacement of the evacuation system 207. A high-frequency power is supplied to the plasma generation coil 201 from the coil-energizing RF power supply 202 to thereby produce plasma within the chamber 203. The high-frequency power supplied herein has a value smaller than a high-frequency power at which electron density jump occurs. Specifically, a value within a range (240 W to 300 W) considering the uniformity and the stability of plasma is used. In this example, the value is 250 W.

After the plasma is stabilized, a high-frequency power is quickly supplied to the RF electrode from the RF electrode-energizing RF power supply 205. Like in the example 2, the high-frequency power need not be set so that the Cr/resist selectivity is low. Therefore, it is sufficient to set the high-frequency power in a condition such that Cr/resist etching characteristics (pattern shape etc.) are excellent, and a value lower than that in the example 1 is sufficient. Herein, the high-frequency power is set in a condition such that the Cr/resist selectivity is equal to 1.7. After the etching of Cr is finished, overetching is appropriately performed. Then, the etching is completed.

In this example 3, the etching can be carried out in the state where the plasma density is low. As a result, it is possible to achieve an effect of reducing the density of radicals contributing to isotropic etching of the resist and an effect of suppressing the rise of the substrate temperature. Thus, the etching amount of the resist in a lateral direction is suppressed.

In addition to the above-mentioned effect of suppressing the etching amount of the resist in the lateral direction, which is achieved by performing the etching in the state where the plasma density is low, the organic gas is produced from the RF electrode cover member made of the organic polymer in this example 3 so that an effect of suppressing the etching amount of the resist in the lateral direction by isotropic deposition of the organic gas is exhibited synergistically. As a result, the aforementioned three problems can be solved quite effectively on a practical level.

Specifically:

Regardless of the shape (hole, dot, line and space, etc.) and the size of a pattern (particularly regardless of hole or dot), a conversion difference can be reduced and a difference in shape between a hole and a dot can be reduced.

The linearity is excellent (conversion difference is constant) even if the size of a hole is small.

A photomask is obtained in which the sectional shape of a hole does not depend on the size thereof and, even if the size is small, the verticalness is excellent.

The example 3 is superior to the example 1 in the following respects.

(1) Since a large amount of organic gas produced from the electrode cover having a larger area can be used, it is possible to set a relatively high plasma density as compared with the example 1. This leads to an advantage that a state where the uniformity and the stability of the plasma are excellent can be selected.

(2) Since the organic gas produced from the resist is not relied upon, no limitation is imposed upon the coverage of the resist pattern and the selectivity.

(3) In the organic gas density within the chamber, distribution caused by a mask pattern hardly occur.

Further, the example 3 is superior to the example 2 in that the addition of the organic gas system is not necessary.

COMPARATIVE EXAMPLE

Etching was performed in the manner similar to the example 2 except that the organic gas (ethanol) was not added and that, when the high-frequency power (ICP power) supplied to the plasma generation coil 201 from the coil-energizing RF power supply 202 to generate plasma within the chamber 203, the high-frequency power (ICP power) supplied herein was 500 W (a generally used condition where electron density jump occurs was set). Then, CD linearity was examined. The result is shown in FIG. 5.

Figure 5:
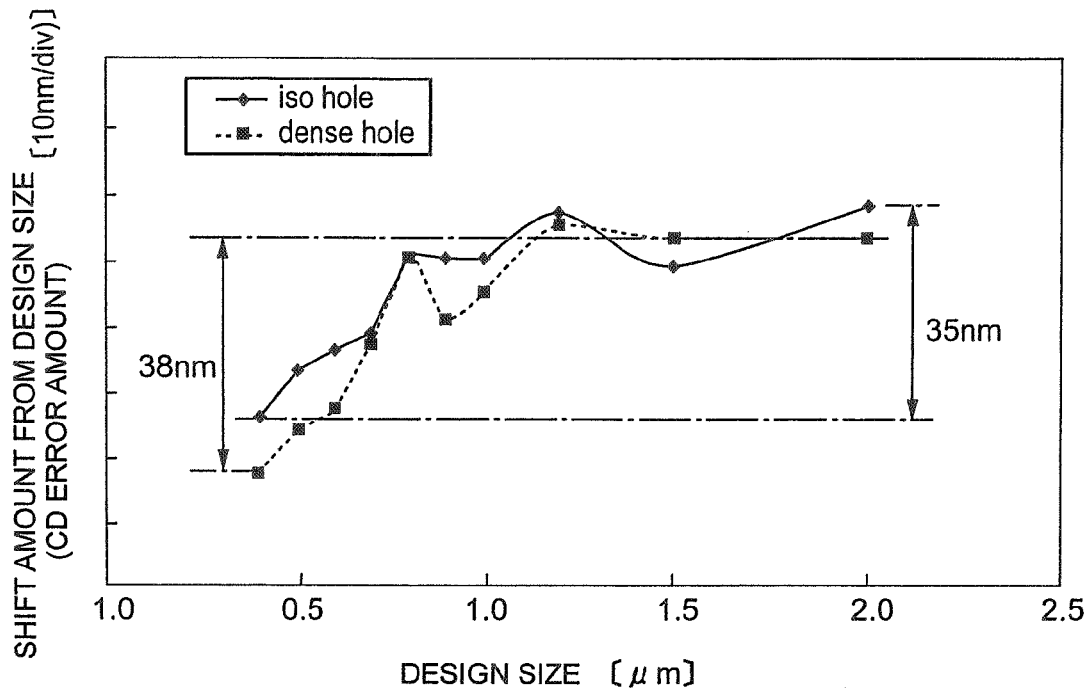
FIG. 5 is a diagram for explaining CD linearity of a pattern obtained in a comparative example.

In FIG. 5, the abscissa represents a design size and the ordinate represents a shift amount (CD error amount) from the design size. Pattern length measurement was performed by CD-SEM for a Cr pattern (isolated holes (iso hole) and densely-packed holes (dense hole)) of 0.4 µm to 2.0 µm. From FIG. 5, it is understood that, under the condition of the comparative example (no ethanol added; ICP power of 500 W), the CD error is large with respect to the design size of 1.0 µm or less and the CD linearity error is about 40 nm, thus the CD linearity is inferior.

Figure 6:
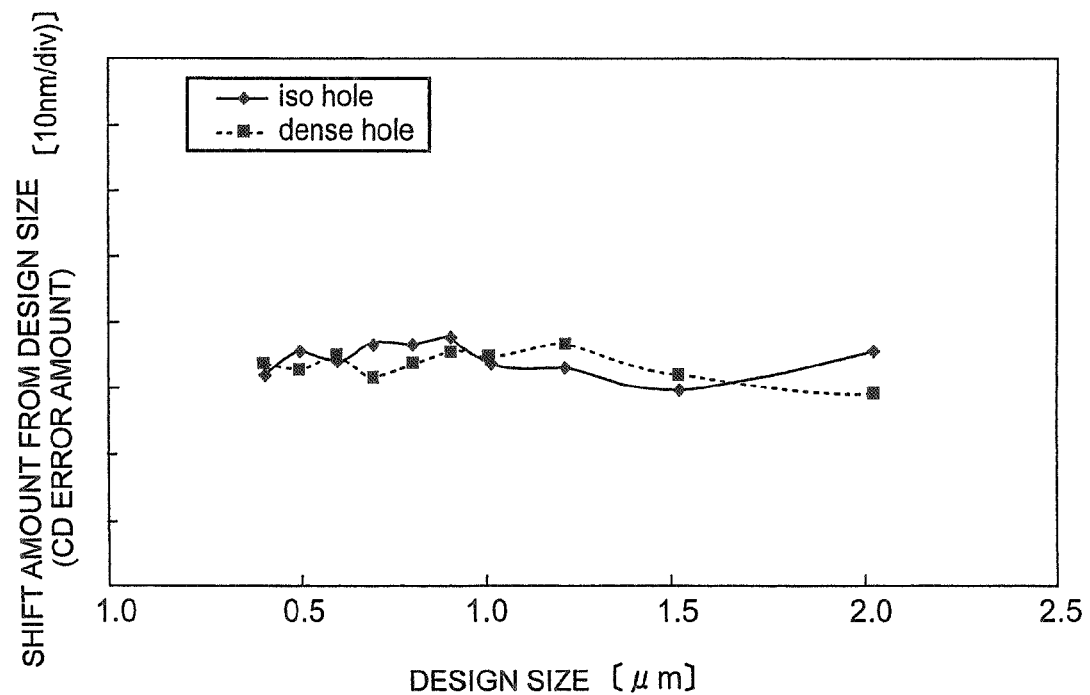
FIG. 6 is a diagram for explaining CD linearity of a pattern obtained in the example 2.

On the other hand, under the condition of the example 2 (ethanol added; ICP power of 250 W), the CD linearity error is 8 nm or less for the size of 0.4 µm to 2.0 µm as shown in FIG. 6. It is understood that the pattern linearity is quite excellent.

The relationship between the sectional shape of the Cr pattern and the ICP power was examined. The results are shown in FIG. 7 (SEM photograph).

Figure 7:
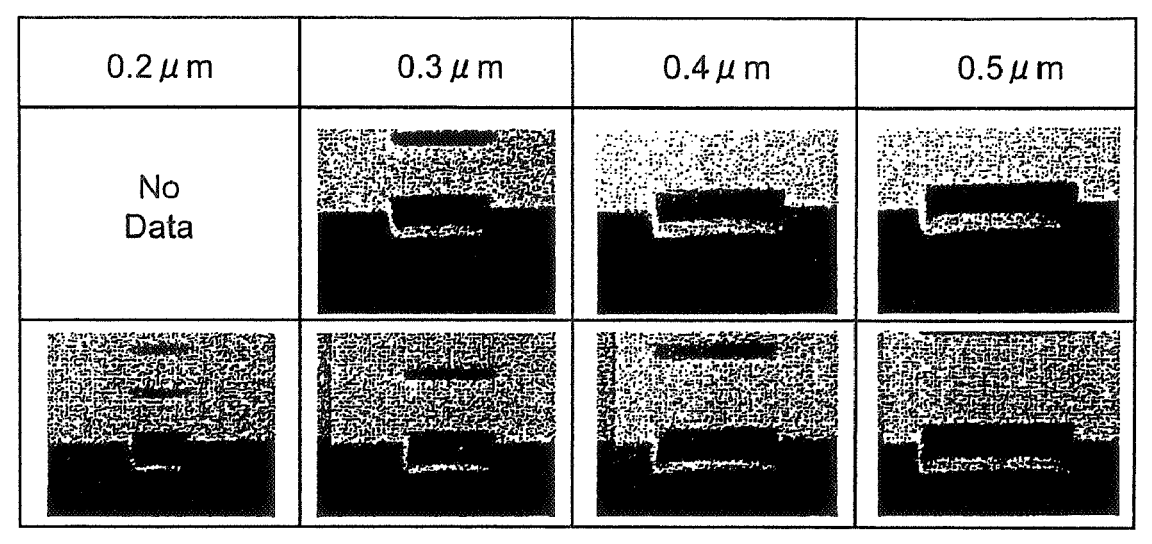

FIG. 7 is an SEM photograph showing sectional shapes of Cr patterns of 0.5 µm, 0.4 µm, 0.3 µm, and 0.2 µm. In FIG. 7, the upper row shows the sectional shapes of the Cr patterns obtained in the comparative example (no ethanol added; ICP power of 500 W) while the lower row shows the sectional shapes of the Cr patterns obtained in the example 2 (ethanol added; ICP power of 250 W).

It is understood that, in the comparative example in the upper row of FIG. 7, the sectional shape of the hole is tapered and the verticalness is degraded as the size decreases and that, in the example 2 in the lower row of FIG. 7, the sectional shape of the hole does not depend on the size and, even if the size is small, the verticalness is excellent (linearity of the shape is excellent).

It is noted here that the present invention is not limited to the above-mentioned examples.

In the example 2, ethanol is used as the organic gas. However, use may also be made of an organic gas (for example, methane, ethane, acetylene, vinyl chloride, hydrogen cyanide, etc.) containing carbon and hydrogen without containing halogen other than chlorine, which is usable in a mass flow controller.

In the example 3, polystyrene is used as the electrode cover. However, an organic polymer (for example, polyester, polyvinyl chloride, melamine, polyethylene, etc.) containing carbon and hydrogen without containing halogen other than chlorine as well as carbon may be used also.

Figure 4:
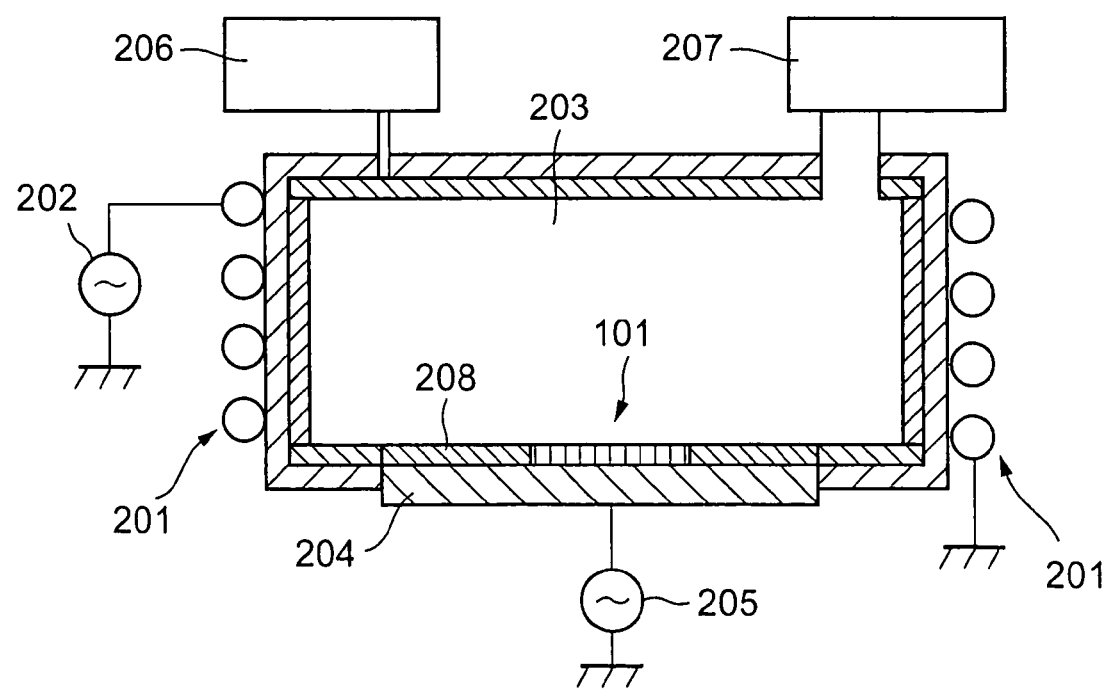
FIG. 4 is a schematic diagram for explaining another modification of the etching apparatus.

In the example 3, the above-mentioned material (organic polymer) is applicable to the electrode cover 208 and a chamber inner wall portion as shown in FIG. 4 (including an embodiment where the material is provided partly on the inner wall). The present invention also covers an embodiment (not shown) in which the above-mentioned material (organic polymer) is applied only to the chamber inner wall portion (including an embodiment where the material is provided partly on the inner wall).

In the present invention, the ICP power can be appropriately adjusted and modified within the scope of the gist of the present invention depending on an apparatus to be used.

INDUSTRIAL APPLICABILITY

The present invention exhibits the following effects.

(1) With respect to the above-mentioned first problem, a conversion difference can be reduced regardless of the shape of a pattern (opening pattern (hole), shielding pattern (dot), line and space, etc.), a size difference, or a density difference (particularly regardless of hole or dot) and a difference in shape between a hole and a dot can be reduced.

(2) With respect to the above-mentioned second problem, the CD linearity is excellent (conversion difference is constant) even if the size of a hole is small.

(3) With respect to the above-mentioned third problem, the sectional shape of a hole does not depend on the size thereof and, even if the size is small, the verticalness is excellent.

In relation to the aforementioned third problem, in case where the mask length measurement is carried out by the use of an optical length meter, the improvement in linearity of the shape makes it possible to perform length measurement for those figures different in size under the same measurement condition.

The invention claimed is:

1. A method of etching a chromium-based thin film, the thin film comprising chromium, by use of a resist pattern placed thereon as a mask, comprising:
   setting a plasma excitation power to a value lower than a power value at which electron density jump is caused to occur,
   supplying plasma excitation power at said set power value to a dry etching gas to excite plasma so that a chemical species is generated, said dry etching gas comprising $Cl_2$ and $O_2$, and
   carrying out the etching of the thin film by use of the chemical species,
   so that verticalness of the sectional shape of the pattern formed in the thin film is enhanced.

2. The method of etching a chromium-based thin film according to claim 1, wherein at least a part of the chemical species is supplied in the direction perpendicular to the thin film so that the resist layer which forms the resist pattern is etched to generate an organic substance, and
   an etching selectivity S between a resist layer and the thin film is smaller than 1.5, whereby S is defined as:
   S=(etching rate of the thin film/etching rate of the resist layer).

3. The method of etching a chromium-based thin film according to claim 2, wherein at least a part of the chemical species is supplied in the direction perpendicular to the thin film by applying a high-frequency power.

4. The method of claim 3 wherein a high-frequency power is applied to the chemical species, said plasma excitation power being at least 10 times of the high-frequency power.

5. The method of etching a chromium-based thin film according to claim 3, wherein the resist layer which forms the resist pattern has a coverage of 70% or more of the thin film.

6. The method of etching a chromium-based thin film according to claim 5, wherein the high-frequency power is applied so that an organic substance be deposited on a side wall of the resist pattern and to be etched by an isotropic etching component generated during the etching.

7. The method of etching a chromium-based thin film according to claim 6, wherein the dry etching gas further contains helium.

8. The method of etching a chromium-based thin film according to claim 7, wherein the thin film is etched in presence of an organic substance other than the resist layer and a derivative thereof.

9. The method of etching a chromium-based thin film according to claim 8, wherein the organic substance comprises an organic gas which is introduced to the dry etching gas.

10. The method of etching a chromium-based thin film according to claim 8, wherein an organic substance comprises an organic polymer which is disposed in an etching chamber where etching is carried out.

11. A method of etching a chromium-based thin film by processing an object comprising the chromium-based thin film containing chromium, by use of a resist pattern placed thereon as a mask, comprising:
   setting a plasma excitation power to a value lower than a power value at which electron density jump is caused to occur,
   supplying a plasma excitation power at said set power value to a dry etching gas to excite plasma so that a chemical species is generated, said dry etching gas comprising $Cl_2$ and $O_2$ and
   carrying out the etching of the thin film by use of the chemical species, so that the thin film is etched in presence of an organic substance other than a resist layer which forms the resist pattern and a derivative of the resist pattern, and
   an organic product is deposited on a side wall of the resist layer during the etching.

12. The method of etching a chromium-based thin film according to claim 11, wherein a resist layer which forms the resist pattern has a coverage smaller than 70% of the thin film.

13. The method of etching a chromium-based thin film according to claim 12, wherein the organic substance comprises an organic polymer which is disposed in an etching chamber where etching is carried out.

14. The method of etching a chromium-based thin film according to claim 13, wherein the dry etching gas further contains helium.

15. The method of etching a chromium-based thin film according to claim 12, wherein the organic substance comprises an organic gas which is introduced to the dry etching gas.

16. The method of etching a chromium-based thin film according to claim 13, wherein the amount of the organic gas is 30 vol % or less of the dry etching gas.

17. The method of etching a chromium-based thin film according to claim 16, wherein the organic gas comprises ethanol.

18. A method of manufacturing a photo mask from a photo mask blank comprising a transparent substrate and a light-shielding thin film formed on the transparent substrate, said thin film comprising chromium, said method comprising etching the thin film by use of a resist pattern placed thereon as a mask, said etching comprising:

setting a plasma excitation power to a value lower than a power value at which electron density jump is caused to occur, supplying a plasma excitation power at said set power value to a dry etching gas to excite plasma so that a chemical species is generated, said dry etching gas comprising a $Cl_2$ and $O_2$, and carrying out the etching of the thin film by use of the chemical species, such that at least a part of the chemical species is supplied toward the thin film in a direct ion perpendicular to the thin film.

19. The method of manufacturing a photo mask according to claim 18, wherein, by etching the thin film, a pattern including a pattern of which a design size is between 0.4 μm or more and 2.0 μm and of which a CD linearity error is 15 nm or less is formed.

20. The method of claim 18 wherein a high-frequency power is applied to the chemical species, said plasma excitation power being at least 10 times of the high-frequency power.

21. The method of manufacturing a photo mask according to claim 18, wherein at least a part of the chemical species is supplied in the direction perpendicular to the thin film so that the resist layer which forms the resist pattern is etched to generate an organic substance, and an etching selectivity S between a resist layer and the thin film is smaller than 1.5, whereby S is defined as: S=(etching rate of the thin film/etching rate of the resist layer).

22. The method of manufacturing a photo mask according to claim 21, wherein, by etching the thin film, a pattern including an optical proximity correction (OPC) pattern is formed.

23. A method of manufacturing a photo mask from a photo mask blank comprising a transparent substrate and a light-shielding thin film formed on the transparent substrate, said thin film comprising chromium, said method comprising etching the thin film by use of a resist pattern placed thereon as a mask, said etching comprising:

setting a plasma excitation power to a value lower than a power value at which electron density jump is caused to occur, supplying a plasma excitation power at said set power value to a dry etching gas to excite plasma so that a chemical species is generated, said dry etching gas comprising $Cl_2$ and $O_2$, and carrying out the etching of the thin film by use of the chemical species, so that the thin film is etched in presence of an organic substance other than a resist layer which forms the resist pattern and a derivative of the resist pattern, and an organic product he is deposited on a side wall of the resist layer during the etching.

24. A method of etching a chromium-based thin film with an etching apparatus having a chamber, the thin film comprising chromium, by use of a resist pattern placed thereon as a mask, comprising:

setting a plasma excitation power to a value lower than a power at which electron density jump is caused to occur in said chamber, supplying plasma excitation power at said set value to a dry etching gas in said chamber to excite plasma in said chamber so that a chemical species is generated, said dry etching gas comprising $Cl_2$ and $O_2$, and carrying out the etching of the thin film in said chamber by use of the chemical species, so that verticalness of the sectional shape of the pattern formed in the thin film is enhanced.

25. The method of claim 24, the generated chemical species in said chamber has suppressed radicals in said plasma so that isotropic etching is avoided.

\* \* \* \* \*